(12) United States Patent
Harnett (10) Patent No.: US 10,612,172 B2
(45) Date of Patent: Apr. 7, 2020

(54) ANISOTROPIC CONDUCTIVE TREADS FOR ELECTRICAL CONNECTIONS IN SOFT ELECTRONICS

(71) Applicant: UNIVERSITY OF LOUISVILLE RESEARCH FOUNDATION, INC., Louisville, KY (US)

(72) Inventor: Cindy Harnett, Louisville, KY (US)

(73) Assignee: University of Louisville Research Foundation, Inc., Louisville, KY (US)

( * ) Notice: Subject to any disclaimer, the term of this patent is extended or adjusted under 35 U.S.C. 154(b) by 0 days.

(21) Appl. No.: 16/344,212

(22) PCT Filed: Oct. 24, 2017

(86) PCT No.: PCT/US2017/057964
§ 371 (c)(1),
(2) Date: Apr. 23, 2019

(87) PCT Pub. No.: WO2018/081038
PCT Pub. Date: May 3, 2018

(65) Prior Publication Data
US 2019/0257015 A1    Aug. 22, 2019

Related U.S. Application Data

(60) Provisional application No. 62/411,930, filed on Oct. 24, 2016.

(51) Int. Cl.
*D05B 19/12* (2006.01)
*H05K 1/02* (2006.01)
(Continued)

(52) U.S. Cl.
CPC .............. *D05B 19/12* (2013.01); *H05K 1/00* (2013.01); *H05K 1/028* (2013.01); *H05K 1/038* (2013.01);
(Continued)

(58) Field of Classification Search
CPC ...... D05B 19/12; D05B 19/003; D05B 19/02; D05D 2303/40; D10B 2401/16;
(Continued)

(56) References Cited

U.S. PATENT DOCUMENTS 3,130,257 A * 4/1964 Rott .................... H05K 7/06
427/97.4
3,383,487 A * 5/1968 Wiener ............... H01H 13/702
200/302.1
(Continued)

FOREIGN PATENT DOCUMENTS

DE        197 55 792 C2    5/2001
DE  10 2011 005 606 A1    3/2012

*Primary Examiner* — Timothy J Thompson
*Assistant Examiner* — Rhadames Alonzo Miller
(74) *Attorney, Agent, or Firm* — W & C IP (57) ABSTRACT

An embroidery machine with on-board electronics executing layout and alignment software provides for automated thread installation to establish textile-to-pad contact through the use of anisotropic conductive threads characterized by electrically conductive segments alternating with electrically insulating segments. Present embodiments provide for garments or other fabrics and textiles having flexible circuits integrated on a flexible substrate that bends and moves with the garment in a way not seen with stiff printed circuit boards, which may include multiple textile circuits attached to fabric to impart desired electronic features including connectivity to a printed circuit board external to a garment formed according to the present embodiments, as well as imparting electrical conductivity across seams of a garment sewn together from fabric, while maintaining electrical integrity of neighboring circuits on the same garment.

15 Claims, 3 Drawing Sheets

(51) Int. Cl.
*H05K 1/03* (2006.01)
*H05K 1/11* (2006.01)
*H05K 3/10* (2006.01)
*H05K 3/40* (2006.01)
*H05K 3/00* (2006.01)
*H05K 1/00* (2006.01)
*H05K 1/14* (2006.01)

(52) U.S. Cl.
CPC ........... *H05K 1/118* (2013.01); *H05K 3/00* (2013.01); *H05K 3/10* (2013.01); *H05K 3/103* (2013.01); *H05K 3/4046* (2013.01); *D05D 2303/40* (2013.01); *D10B 2401/16* (2013.01); *H05K 1/141* (2013.01); *H05K 2201/09281* (2013.01); *H05K 2201/10287* (2013.01)

(58) Field of Classification Search
CPC ...... D10B 2401/18; H05K 1/03; H05K 1/028; H05K 1/118; H05K 7/06
See application file for complete search history.

(56) References Cited

U.S. PATENT DOCUMENTS

| | | | | |
|---|---|---|---|---|
| 3,646,246 | A | | 2/1972 | Olney, Jr. |
| 4,154,178 | A | | 5/1979 | Brown et al. |
| 4,790,968 | A | * | 12/1988 | Ohkawa ............... H01C 10/106 200/264 |
| 5,906,004 | A | * | 5/1999 | Lebby .................. A41D 31/00 139/425 R |
| 5,932,496 | A | * | 8/1999 | Morris .................. G01L 1/205 205/114 |
| 6,145,735 | A | * | 11/2000 | Mallery ................ B23K 1/008 228/254 |
| 6,210,771 | B1 | * | 4/2001 | Post ....................... H05K 3/10 428/100 |
| 6,333,736 | B1 | * | 12/2001 | Sandbach ............. G06F 3/0414 178/18.03 |
| 6,452,479 | B1 | * | 9/2002 | Sandbach ............. G06F 3/045 338/101 |
| 6,836,029 | B2 | * | 12/2004 | Greenberg ......... H01H 59/0009 200/181 |
| 7,091,436 | B2 | * | 8/2006 | Serban ................. G06F 3/0221 200/508 |
| 7,377,133 | B2 | * | 5/2008 | Sandbach ............. H01H 3/141 66/170 |
| 7,378,608 | B2 | * | 5/2008 | Marmaropoulos .... A41D 31/02 174/117 M |
| 7,388,166 | B2 | * | 6/2008 | Marmaropoulos .... D02G 3/441 200/52 R |
| 8,193,465 | B2 | * | 6/2012 | Yang ...................... A61B 5/00 200/512 |
| 10,175,781 | B2 | * | 1/2019 | Karagozler ............ G06F 3/044 |
| 2002/0121146 | A1 | * | 9/2002 | Manaresi ................ B63H 9/06 73/862.68 |
| 2002/0180578 | A1 | * | 12/2002 | Sandbach ............. G06F 3/045 338/99 |
| 2003/0037966 | A1 | * | 2/2003 | Sandbach ............. G01L 1/205 178/18.05 |
| 2003/0146902 | A1 | * | 8/2003 | Sandbach ............. G06F 1/1632 345/168 |
| 2006/0071751 | A1 | * | 4/2006 | Wagner ................ H01H 13/702 338/47 |
| 2006/0246744 | A1 | * | 11/2006 | Marmaropoulos .... A41D 1/005 439/37 |
| 2006/0251854 | A1 | * | 11/2006 | Marmaropoulos .... A41D 31/02 428/100 |
| 2007/0063835 | A1 | * | 3/2007 | Marmaropoulos .... A41D 1/005 340/540 |
| 2007/0141939 | A1 | * | 6/2007 | Sandbach ............. H01H 3/141 442/304 |
| 2012/0199056 | A1 | * | 8/2012 | Bayram ................ D05B 23/00 112/475.08 |
| 2015/0359485 | A1 | * | 12/2015 | Berg ..................... A61B 5/6804 600/388 |
| 2018/0230631 | A1 | * | 8/2018 | Legrand ................ D05B 93/00 |
| 2019/0015233 | A1 | * | 1/2019 | Galloway .............. B25J 15/12 |
| 2019/0079582 | A1 | * | 3/2019 | Lyons ................... G06F 3/014 |
| 2019/0242036 | A1 | * | 8/2019 | Bogan ................... H05K 3/02 |

* cited by examiner

ANISOTROPIC CONDUCTIVE TREADS FOR ELECTRICAL CONNECTIONS IN SOFT ELECTRONICS

PRIORITY STATEMENT

This international patent application claims priority to and benefit from U.S. Provisional patent application No. 62/411,930, filed on 24 Oct. 2016, the contents of which are fully incorporated by reference herein.

FIELD OF INVENTION

The pertinent field involves electrical connection technology for soft electronics that establishes and maintains electrical connections in textile articles such as, but not limited to, clothing garments and wearable assistive or sensing devices. As opposed to devices and parts that use stiff polymer printed circuit boards (PCBs), soft electronics consist of sensors and other electronic devices supported on flexible materials, such as textiles, thin plastic films, and similar pliable articles in which thin wires, conductive threads, or printed traces serve as electrical conductors.

BACKGROUND

The idea of merging electronics with textiles and other flexible articles is not new, but problems are encountered in that textiles are not as dimensionally stable as firm PCBs formed from stiff materials. To add a level of firmness, connections between electronic textile (e-textile) devices are made using snaps or other single-point connectors aligned to individual conductive traces. However, single-point connectors create cost- and manufacturing-limitations on the way electronic signals are transmitted to a receiving device, making assembly and production less efficient and more costly.

Moreover, because microprocessors and most sensors are more compatible with PCBs, it has made it harder to assimilate the use of multi-pin electrical connections into the textile field, including wearable electronics. Compounding the difficulty, long-established PCB soldering technologies do not work with textile circuits, given that the high soldering temperatures (400 C and up) will melt or damage the substrates.

To further understand the challenge of establishing and maintaining electrical connections in a flexible material, consider a familiar product: flat panel monitors with liquid crystal displays (LCD). Such displays use a "zebra connector" or "z-axis conductive tape" containing microscale elements that conduct only through the thickness of the material, not laterally. For example, in a LCD, soft elastomeric connectors bring signals from hundreds of copper traces, positioned on the control PCB, to thin-film conductive oxide traces positioned on the glass screen. There is no need for soldering, nor for an expensive rigid plug-in connector, nor for precise alignment. However, the zebra connector method depends on the PCB and glass being rigid enough that the elastomer can be compressed by clamping. So while connections based on anisotropic conductive materials (ACM) like z-axis tape are feasible for flat panel displays, the principles do not work with textiles and other flexible, non-rigid materials. In short, Z-axis conductive tape was not designed for the porous surfaces of e-textiles, and clamping against a rigid surface would still be needed for reliable electrical contact using the tape.

According to present embodiments, anisotropic conductive thread (ACT) is a type of (ACM) suitable to provide both mechanical and electrical connections needed to assimilate textiles with electronics. ACT does so a manner that is both effective and cost-efficient. Further developments in applications of ACT to solve these problems in the field of textiles are described in more detail below.

SUMMARY OF EMBODIMENTS

Embodiments disclosed herein include an article comprising a flexible substrate with an electronic circuit (i.e., circuit) formed therein, which can be a textile circuit for establishing electrical connections in a garment or other flexible, non-rigid item. In some embodiments, the circuit includes at least first and second electrical contacts, with the circuit being electrically and mechanically connected to the substrate with use of anisotropic conductive material (e.g., ACT) having alternating conductive (i.e., electrically conductive) segments and insulating (i.e., electrically insulating) segments. At least one conductive segment passes through the substrate and the electrical contact, and at least one insulating segment is part of a stitch that passes between said first and second electrical contacts.

One approach to capitalizing on ACT in these contexts involves an automated thread installation process that integrates design file software, such as used conventionally with conventional embroidery machines, running layout software and alignment software. Layout and alignment refer to controlling where a section of thread travels in 3-D space both over and through a substrate, as well as the programmable path of thread that connects pieces together. With the practice of present embodiments, connections are made efficiently to minimize waste and the attendant problems that accompany thread overlap.

Certain embodiments provide for a non-woven textile establishing electrical contact when an electrical contact receives signal inputs emanating from the bodily systems of the person wearing it. The contact might be directly in contact with the skin of the wearer, or placed between layers of fabric in which the layer between the contact and the skin is thin enough that it does not interfere with the signals. In some embodiments, the electrical contact comprises a sensor that transmits sensed signals to a microprocessor or other controller in electrical contact with the sensor. Through the electrical connections, various kinds of sensing signals produced by the wearer are accessed, transmitted, stored, and used. These may include, but are not limited to, body temperature, heart beat and rate, respiration, dehydration, electromyography sensing, sleep patterns, and biomechanical aspects of physical exertion including the intensity and frequency of pressure applied over a certain body part. Accordingly, present embodiments relate to establishing and maintaining viable electrical connections in a soft garment or other textile environment; the type of signals transmitted does not limit the scope of the present embodiments.

With use of the inventive anisotropic conductive threads, a number of applications become readily apparent. These include, but are not limited to, connecting microelectromechanical (MEMS) silicon wafers to flexible, stretchy electronic textile systems for sensor-equipped wearable devices; cost-effective connectors that attach more robust and comparatively expensive printed circuit boards such as wireless communication modules to wearable, disposable textile-based sensors; the repair of flexible conductive circuits, assistive wearable devices, or e-textiles after they have torn; and materials for connecting in a single step conductive traces across a seam in e-textile garments that contain sensors and which are assembled from individual pieces. It will be appreciated that the approaches and applications of the technology disclosed herein can be used on garments, textiles, and a wide variety of soft, flexible substrates that move and bend (wearable garments being one example), but for which electrical connections are nonetheless needed and beneficial. The word "substrate" is used herein to encompass various kinds of articles. One advantage to the present embodiments is that the threads are used mechanically to attach pieces of substrate together, as well as electrically to establish and maintain electrical connections.

In terms of specific examples, the anisotropic conductive thread described herein can join textile circuits in pieces of substrate to form a single item, or can be machine-aligned with holes in an on-board PCB, or can be set up with a card edge connector that plugs into an external PCB tied to a textile circuit established within the substrate. The capabilities are beneficial because, traditionally, most microprocessors and sensors have been compatible with PCBs but not with soft circuits, so multi-pin electrical connections need to be made to integrate the different technologies. However, because of high soldering temperatures, long-established PCB soldering technologies do not work with e-textiles that use textile (i.e., soft) circuits, polymer-based flex circuits, and the like. Anisotropic conductive thread, on the other hand, provides a viable solution to the limitations seen in traditional approaches.

Further advantages include the fact that the anisotropic conductive thread does not need to be cut to make isolated circuits. The advantages of not cutting during the manufacturing process include a reduction in process steps and greater production efficiency, and maintaining electrical integrity because cutting produces stray conductive fibers that can migrate and potentially cause electrical shorts. Further advantages include improved electrical connection within a substrate. Another advantage is that the machines that stitch these articles together are generally simpler to use in that the embroidery machines for installing anisotropic conductive thread need not contain automated cutting features.

Additional advantages involve maintaining the mechanical strength of the bond within the pieces of substrate which are joined, by avoiding one or more cuts in the thread that could become a place where the thread unravels, which also improves the mechanical strength of the substrate when connectors are repeatedly plugged and unplugged. Another advantage is that sewing produces a connection from outside the material. Unlike conductive tape or elastomers which are sometimes used for connecting two layers of textile material, anisotropic conductive thread can come in from above or below the patch, it can pierce through insulators, and it can join hidden conductors together electrically and mechanically. This process reduces the amount of disassembly that needs to be done when making fast repairs to a torn soft circuit or fixing an intermittent connection. Accordingly, these and other benefits will be made more apparent from the following discussion.

FIGURES

The drawings, schematics, figures, and descriptions contained in the Appendices are to be understood as illustrative of steps, structures, features and aspects of the present embodiments and do not limit the scope of the embodiments described herein. The scope of the application is not limited to the precise arrangements or scales as shown in the figures.

FIGS. 1A (with inset) and 1B, collectively, provide a perspective view of anisotropic conductive thread connecting a textile circuit for a soft substrate to a PCB, according to multiple embodiments and alternatives.

MULTIPLE EMBODIMENTS AND ALTERNATIVES

Figures 1A, 1B:
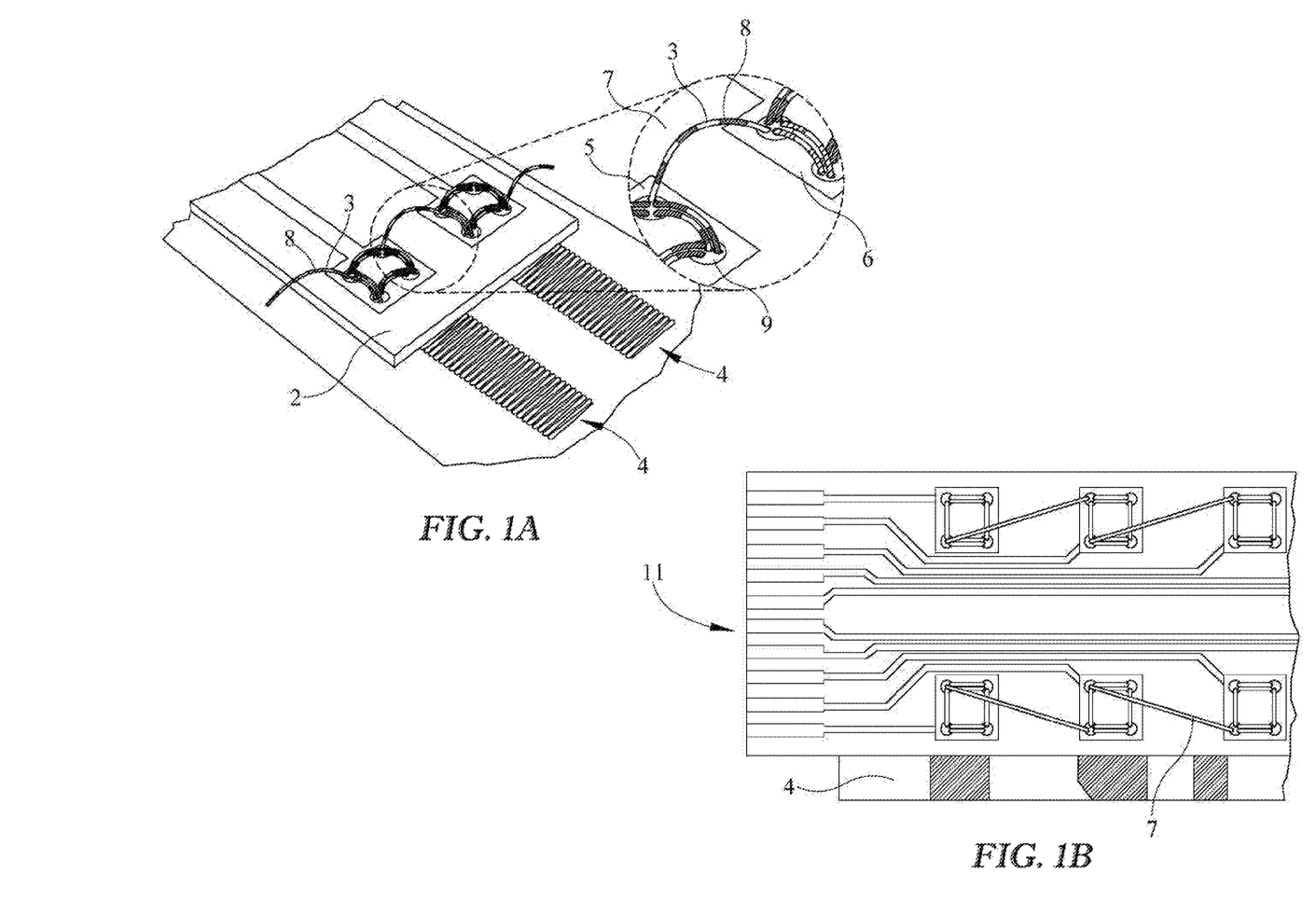

FIG. 1A with inset shows anisotropic conductive thread (ACT) used as stitching to connect electrical contact pads to a PCB and to an underlying conductive textile (substrate). The ACT has conductive segments which are black (or, dark) that alternate with insulating segments that are white (or, light) in the figure. The end product contains connectors that attach the PCB to wearable, disposable textile-based sensors incorporated with the substrate, in which the PCB contains machine-aligned holes through which the thread will pass. In some embodiments, the PCB comprises a wireless communication module such as a Bluetooth or WiFi module, for transmitting signals received from the sensors.

In this aspect of the disclosure, a computer-controlled embroidery machine, i.e., a needle-directing machine for placement of threads through a fabric's thickness and laterally across a fabric according to a determined path, can be used to align the stitches with the pre-formed holes in the PCB. Such embroidery machines (not shown) are known in the art and execute program instructions to control the placement of thread that stitches together different pieces of fabric, forming seams (i.e., each seam being a line along with two pieces of fabric are sewn or otherwise joined together). The basic parts of embroidery machines, as with the machines themselves, are conventional. They consist of physical structures that contain the actual needle(s) that perform the stitching of thread to a fabric, and also that control the needle's up and down movement while the needle traverses across and through the fabric. Such machines may also include physical structures that hold the fabric in place, securing it during stitching, or they may be designed to work integrally with such holding structures such as one or more mounted frames that are positioned relative to the needle as the thread is stitched.

An example of a commercial embroidery machine is a Brother® embroidery sewing machine with an embroidery unit executing program instructions stored in the PES file type, a format commonly implemented as a native embroidery file format. Bernina likewise makes a similar machine. With such machines, data files can be created as known in the art for the storage of program instructions for creating embroideries with a sewing machine. The instructions are read and executed by a processor or microprocessor configured with the embroidery machine as known in the art, which provides computer-implemented programming for a path (both linear and zigzag) giving proper placement of stitching according to a desired pattern as determined by a user.

In some embodiments, the above-referenced processing occurs through one or more general or special purpose microprocessors (not shown) executing program instructions for performing various layout, alignment, and positioning calculations as known in the art and as further discussed herein. In non-limiting fashion, processing components may include or be communicatively coupled to computer readable storage media such as, for example memory, which may optionally include read-only memory (ROM), random access memory (RAM), non-volatile RAM (NVRAIVI), optical media, magnetic media, semiconductor memory devices, flash memory devices, mass data storage device (e.g., a hard drive, CD-ROM and/or DVD units) and/or other storage as is known in the art. Additionally, without limitation, such processing components may include or be communicatively coupled to memory having computer readable and executable program instructions, rules, and/or routines (any set of which may be referred to herein generally as "Instructions") which, when executed by the microprocessor, cause the physical structures of an exemplary embroidery machine to perform the steps as described herein. As desired, the microprocessor may be coupled to complementary components (not shown), for example user interface screens, key pads, and operational indicators responsive to user input for controlling the movement of the anisotropic conductive thread as it traverses the fabric, or other devices having memory such as, for example, monitors, smart phones, and wearable watch monitoring devices for display of transmissions based on sensed data from the wearer of the garment.

As is further known, the above-mentioned physical structures of a conventional embroidery machine executing program instructions (i.e., software) may include the arm and head working in tandem to create the stitching as the arm moves the hooped fabric stitch according to a predetermined path programmed into the software instructions, while the head contains the needles, thread, and needle bar for controlling the up and down movements of the needle(s) during stitching. The electronic aspects of such machines often include computer storage memory cards that store pattern and stitch data for a predetermined path that the thread traverses to complete the stitch pattern, as well as visual displays of the various control settings involved with creating a stitch pattern in a fabric.

In this way, a circuit is formed with adequate textile-to-pad contact resistance (e.g., <400 ohms) to carry signals from or to the substrate. In some embodiments, signal transmission is configured for wireless pickup. The inset of FIG. 1A shows, within the region denoted by a broken line arrow, a portion of the ACT. Here is shown a PCB 2 with electrical connections formed between each of a first electrical contact 5 and a second electrical contact 6 with a conductive textile 4. The connections are made by anisotropic conductive thread 7 that passes through one or more holes 9 formed in each contact to secure the PCB to the substrate. (In the inset, there are four holes shown, and the reference numeral—9—is provided for one of these.) In the inset, anisotropic conductive thread 7 is shown comprising alternating electrically conductive segments 8 (represented with dark shading in the inset of FIG. 1A and in later figures) and electrically insulating segments 3 (represented without shading in the inset and in later figures). In this way, the ACT rapidly secures a printed circuit board to a textile circuit both electrically and mechanically without any cutting of the threads between pads, as would normally be required with use of conventional conducting thread. As further shown in FIG. 1B, a low-cost card edge connector 11 can then be tied to a soft circuit formed over conductive textile 4 with use of machine-aligned anisotropic conductive thread 7 (having alternating conductive and insulating segments as shown in FIG. 1A and inset). The connector is thus arranged for electrical connection by plugging into an external PCB (not shown), enabling an article formed with one or more soft circuits to be unplugged and washed after it is worn. Alternatively, the soft circuit(s) is connected wirelessly to a processor or storage device via a Bluetooth module, WiFi, or other wireless means.

Figure 2A:
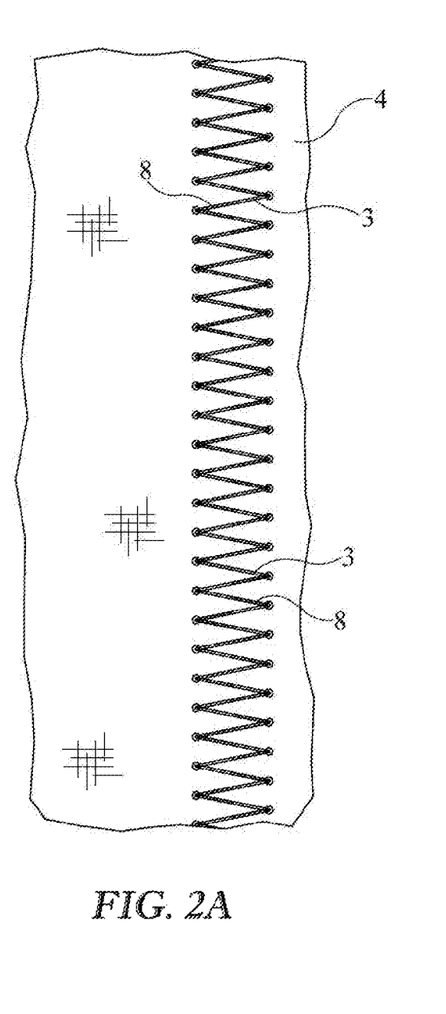
FIGS. 2A and 2B, collectively, offer a perspective view of anisotropic conductive thread for connecting two layered textile circuits, according to multiple embodiments and alternatives.
Figure 2B:
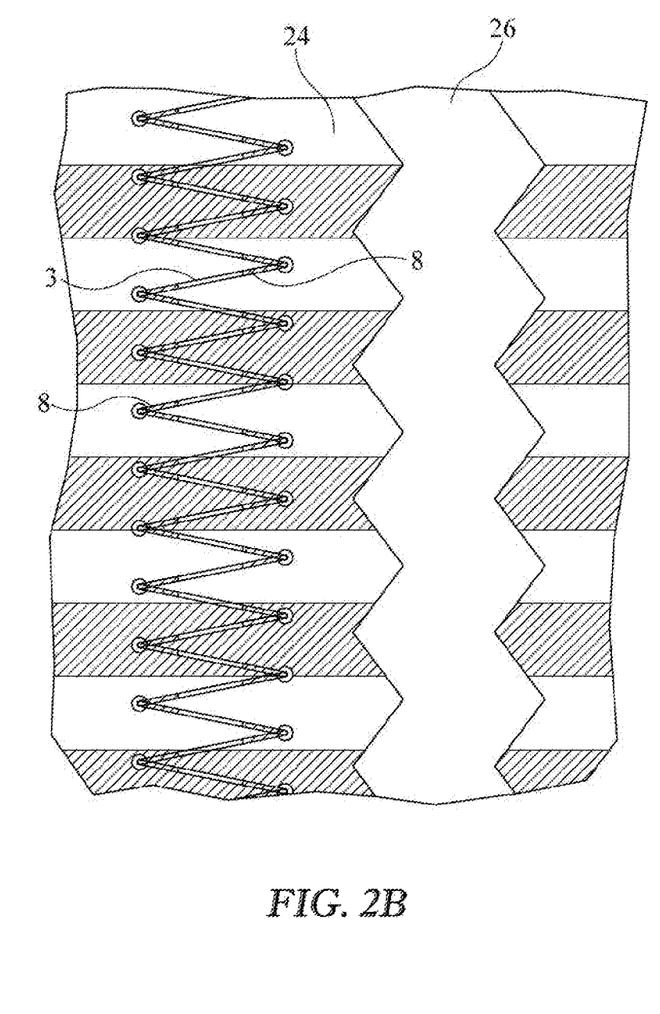

FIGS. 2A and 2B show anisotropic conductive thread comprising electrically conductive segments 8 and electrically insulating segments 3, connecting multiple textile circuits to join two layered textile circuits when no PCB is present. One application of such connections would be the attaching of silicon wafers to flexible, stretchy electronic textile systems for sensor-equipped wearable devices. Joining two textile circuits is necessary when assembling a garment or other pieced-together design from cut fabrics that must provide conductivity across seams. FIG. 2B illustrates a textile circuit with a first fabric layer 24 joined to a second fabric layer 26 having a separate textile circuit. The separate circuits are electrically isolated because they are joined with insulating segments of anisotropic conductive threads. Optionally, the alternating conductive/insulating segments could be formed by chemically etching the outer silver from segments of commercially-available silver-plated nylon thread, as one of many available techniques for providing the desired properties in a particular segment of the thread. The end result in these figures shows ACT as the top thread and ordinary insulating thread as the lower thread in a zig zag pattern, but other arrangements can be used. The anisotropic conductive thread is positioned by continuous stitching using an embroidery machine running layout and alignment software.

As part of the process of forming such an article that has a textile circuit integral with a soft flexible substrate, a suitable embroidery machine is equipped with an embroidery module that executes embroidery software for the layout and alignment of the pattern. The machines should have built-in rotation functions or the ability to run software that provides rotation in addition to the linear and angular movement of the stitch pattern. Several models of Bernina® embroidery machines or other commercially available embroidery machines provide these capabilities, or can be modified with layout and alignment control software to provide these capabilities. Using appropriate conversion software, the embroidery pattern positions the respective conductive and insulating segments. Conductive segments travel a path through the material to establish the intended connections. In turn, insulating segments of thread travel a path that holds the article together and maintains alignment between patches. In some embodiments, insulating segments are electrically isolated segments with a resistance in the 200 ohm range.

Generally, two components of layout and alignment software are the embroidery file that contains the above-referenced program instructions and registration marks. Registration marks serve as reference points for the needle to be positioned in relation to while traversing a pre-determined path. This path represents a pattern the anisotropic conductive thread travels as the anisotropic conductive thread is stitched to the fabric, i.e., through the fabric thickness in some positions, and laterally across the fabric in other positions. In some embodiments, layout and alignment software utilizes two registration marks, though the number of registration marks is not considered to be limiting.

In some embodiments, the program instructions establish an imaginary grid over the fabric having at least X- and Y-axes, wherein every point along the path is then determined and programmed into the instructions based on distance and angle relative to one or more of the registration marks. The X-axis or Y-axis could be considered a first spatial dimension, while the Z-axis being vertical relative to the surface of the fabric could be considered a second spatial dimension. The threads of present embodiments are considered anisotropic because the alternating segments provide for different conductivity values as compared between such first and second spatial dimensions.

Inkscape® is a type of vector graphics editing software and serves as a suitable example of a program that uses reference marks to execute programmed motion along a path. Such a program can be utilized by persons of skill in the art of digitally-controlled embroidery systems to generate a programmable path along which the stitching of the fabric with anisotropic conductive threads may occur. Offsets refer to the positions of the actual needle as it lines up relative to one or more of the registration marks. For example, in the program instructions, a first registration mark might be referred to as "Registration 1" and a second registration mark as "Registration 2." In generating an embroidery file, a location of "Registration 1 offset 0 inches X-axis; Registration 1 offset 1.0 inch Y-axis" would be a way to denote the needle position at a discrete and specific point in traversing the predetermined path. Likewise, Registration 2 offset 0 inches X-axis; Registration 2 offset−1.0 inch Y-axis" is a similar example with regard to a second registration mark. Additional programming can be provided as known in the art to address the depth of the needle protruding through the fabric during stitching, referred to herein as the Z-axis. Such programming taken in total establishes a routing pattern which establishes not only the path traversed by the anisotropic conductive thread, but also the points at which electrically conductive segments 8 (see FIGS. 2A and 2B) travel through the thickness of a layer of fabric to attach each patch to the fabric.

In some embodiments involving a wearable garment with electrical connections, an electrical contact patch or pad (this disclosure uses "patch" and "pad" interchangeably and synonymously) is positioned on a surface of the substrate that makes direct or indirect contact with the skin of the wearer to receive and transmit sensory signals emanating from the body. In such a scenario, electrical conductance must pass through the fabric of the substrate, in a first spatial dimension that may be thought of as vertical. At the same time, neighboring patches are positioned relative to each other in a second spatial dimension that may be thought of as horizontal. Accordingly, the length of conductive segments is less than the spacing between neighboring patches to avoid causing crosstalk between neighboring circuits. In this way, anisotropic conductive threads also impart predictable contact resistance based on conductive and insulating segments which are well defined, removing the need to cut the thread as one must do when making connections with continuously-conductive thread.

Exemplary approaches to forming anisotropic conductive threads suitable for these applications include starting with a conductive thread and removing conductive segments by etching (i.e., removal), as well as conferring conductive properties on pre-determined segments of an insulating thread (i.e., addition). For the removal approach, it is known to expose segments of a silver-plated nylon thread available commercially (e.g., machine-sewable silver plated nylon 117/17 2-ply) to a silver etchant, such as ceric ammonium nitrate. Optionally, exposure to the etchant is provided at regular increments of uniform length along the thread. This results in thread having some segments which are conductive and some which are insulating. The approach can be as straight forward as wrapping a length of thread around a piece of acrylic plastic, and dipping one side of the plastic piece into the silver etchant but not the other side.

Figure 3A:
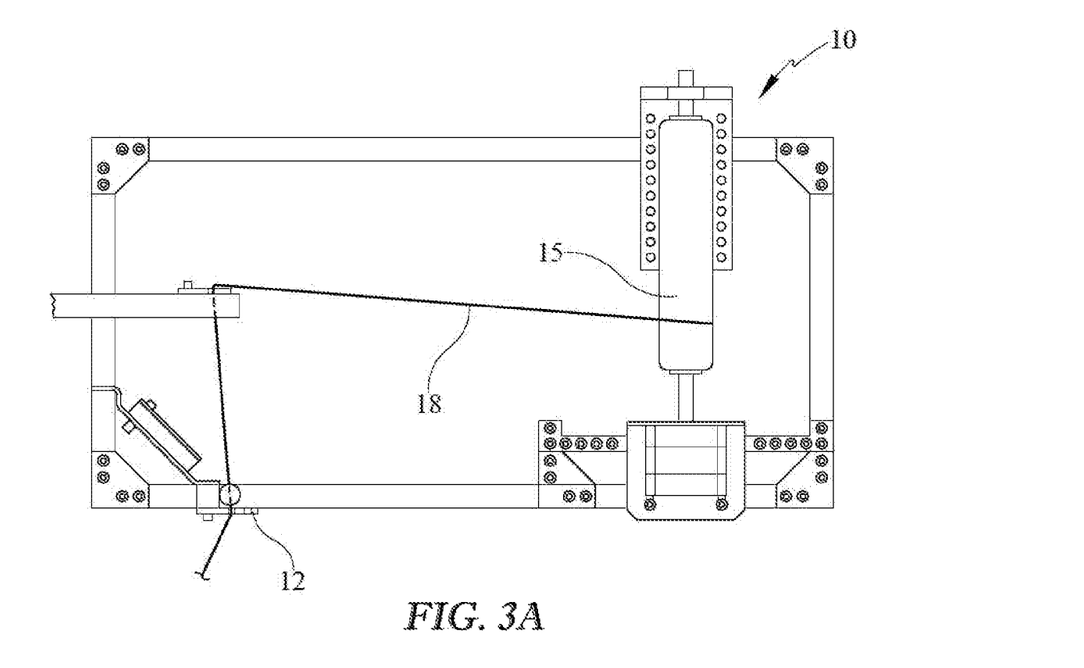
FIGS. 3A and 3B, collectively, show an embodiment from various views of a metal plating method of forming anisotropic conductive thread, according to multiple embodiments and alternatives.
Figure 3B:
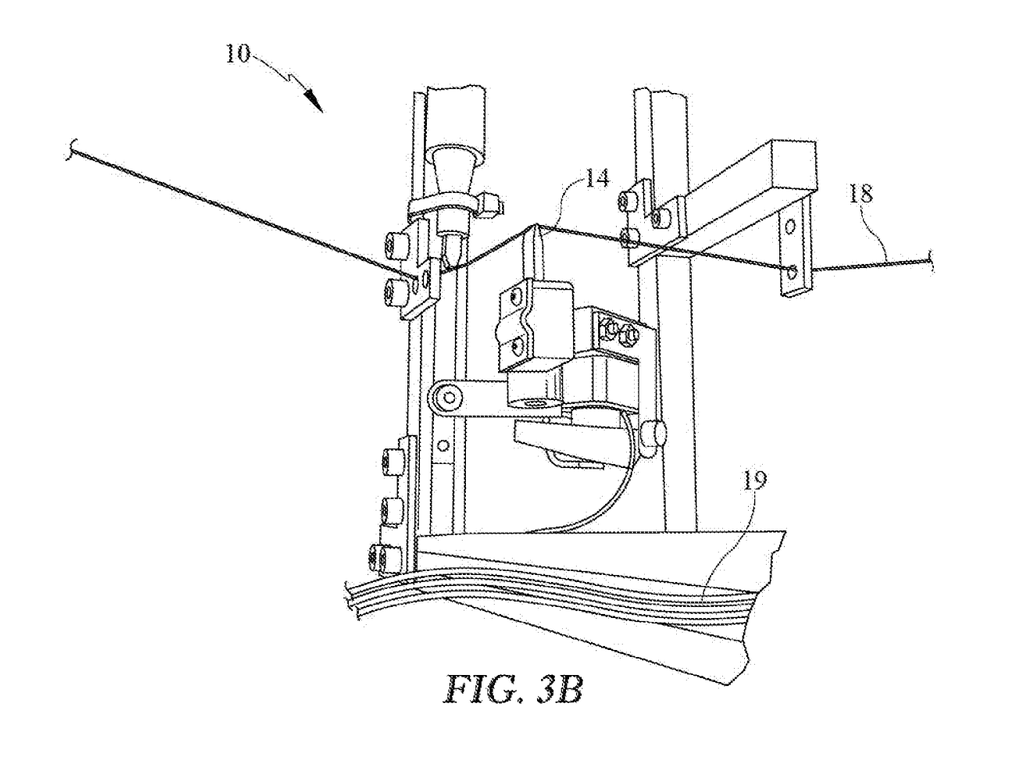

The previous description started with conductive thread and removed conductivity in segments of the thread, e.g., by etching. But while etching provides well defined regions of conductive and insulating segments, in some approaches the segments tend to be rather long (e.g., 2 cm scale), which increases the minimum spacing between patches even when the segments are compressed when the stitching pattern is implemented. Accordingly, FIGS. 3A and 3B illustrate an apparatus for a method providing shorter segments in the few-millimeter range by electroless metal plating (i.e., addition) on insulating thread instead of the removal approach. Thus, as opposed to taking a conducting thread and modifying to include insulating segments, as with etching, as seen with FIGS. 3A and 3B an approach can be used which modifies an insulating thread to confer conductivity upon incremental segments of the thread.

In this particular instance, a metal plating method is used to form anisotropic conductive thread. The end product is then suitable for use in the kinds of applications as discussed in non-limiting fashion with FIGS. 1A, 1B, 2A, and 2B. In a metal plating apparatus 10 according to FIGS. 3A and 3B, sewing thread 18 (such as polyester, which is insulating until modified in accordance with the discussion of these figures) runs past a sensitizer dispenser 12. A thread lifter having tip 14 makes the thread periodically touch the dispenser to create segments that will become metal plated. Thread 18 moves through a drying zone (labeled in FIG. 3A) and collects onto thread uptake reel 15 for plating.

FIG. 3B shows the same apparatus from a view looking directly at the dispenser 12, in which tip 14 is moved into a predetermined position for an increment of time so the thread contacts the tip of dispenser 12 and receives the conductive metal coating. The increment of time is selected by a user, and the duration can be made proportional to the length of the conductive segments. In this particular instance, the movement is by controls operable through cables 19 (not claimed) resulting in the lifting of the thread when contacted by tip 14, but it will be appreciated that other movements are also suitable (e.g., incremental downward or lateral movements of thread 18 cause a thread segment to contact the tip of dispenser 12.) In some embodiments, a suitable sensitizer is tin (II) chloride ($SnCl_2$) and the plating bath is silver nitrate ($AgNO_3$) with glucose as a reducing agent (Tollens reaction) that causes the metal to adhere to the thread used for starting material.

A non-limiting procedure for forming and adding a conductive coating to non-conductive thread starting materials involves silver nitrate, potassium hydroxide, and glucose. In this procedure, 1 g of silver nitrate is added to 35 ml of distilled water and stirred with good ventilation of fumes. This is Solution A. In like manner, 1g of potassium hydroxide pellets is added to 20 ml distilled water. This is Solution B. In like manner, 1 g of glucose is added to 20 ml distilled water. This is Solution C. For the plating solution, Solution A receives about 1.5-2 ml of ammonia under stirring, sufficient for the solution to turn from clear to dark, then back to clear. Solution B is then poured into the ammonia-containing Solution A, in which after Solution B is added the new solution turns dark. Additional ammonia, about 1 ml, is then added until the combined solution turns back to clear. Finally, Solution C is stirred in, and the sensitized thread is placed in the new solution. The plating with electrically conductive coating over the sensitized areas will occur over the course of about 1-2 minutes. After plating, the thread is removed carefully and it contains alternating conductive and insulating segments, as represented in FIG. 1A inset and in other figures. Alternatively, the conductive coating of Solution A is a conductive polymer, a non-limiting example of which is poly(3,4 ethylenedioxythiophene) polystyrene sulfonate. The sulfonated polystyrene portions of this macromolecule contain sulfonyl groups that are deprotonated and thereby negatively charged, while polythiophene portions provide positive charge. Besides poly(3,4 ethylenedioxythiophene) polystyrene sulfonate, other donor-acceptor polymers having alternating portions of donor (electron-rich) and acceptor (electron-poor) may also serve as suitable conductive coatings in forming anisotropic conductive thread.

In some embodiments, starting materials such as commercially available thread which are modified to form anisotropic conductive thread may have a thickness of about 0.5 mm or less in diameter. The thickness and flexibility of the starting material should be adequate to thread into the needle of an embroidery machine, while having sufficient strength and composition to be punched through patches forming the electrical contacts in a substrate. Accordingly, the substances which might be plated over thread to make conductive segments should provide acceptable mechanical flexibility. In this regard, silver nitrate is acceptable, while coatings such as transparent conductive oxides are more brittle and, therefore, less feasible at the range of thicknesses suitable for connections in soft electronics using the inventive anisotropic conductive threads. Generally, brittleness tends to make it too difficult to thread the needle and punch through electronic circuit(s) contained in a substrate. Similarly, the conductive coating must not be too thick because the segments would become too inflexible to thread the needle and punch through the circuit. Thus, selection and thickness of the coating are factors in establishing and maintaining conductivity within the substrate. At the same time, it might be possible in some circumstances to overcome mechanical flexibility problems by reducing the thickness of the coating, as a way to make even relatively brittle coatings work on flexible and even stretchable substrates.

It is to be understood that the embodiments described and/or claimed herein are not limited in their application to the details of the teachings and descriptions set forth herein, or as illustrated in an example. Rather, it will be understood that the embodiments are capable of being practiced or carried out in multiple ways, according to many alternatives based on these descriptions and teachings.

Further, it will be understood that the phraseology and terminology used herein is for the purpose of description and should not be regarded as limiting. The use herein of "including," "comprising," "e.g.," "such as, for example," "containing," or "having" and variations of those words is meant in a non-limiting way to encompass the items listed thereafter, and equivalents of those, as well as additional items. Accordingly, the foregoing descriptions are meant to illustrate a number of embodiments and alternatives, rather than limiting to the precise forms and processes disclosed herein. The descriptions herein are not intended to be exhaustive. It will be understood by those having ordinary skill in the art that modifications and variations of these embodiments are reasonably possible in light of the above teachings and descriptions.

What is claimed is:

1. A method that uses a needle-directing machine having at least a needle, a needle bar, a head, an arm, and a processor that executes computer readable program instructions, the method being for attaching to a fabric having a thickness an electronic circuit arranged on a patch, the method comprising:

stitching a circuit to the fabric with anisotropic conductive thread having electrically conductive segments and electrically insulating segments;

wherein stitching the circuit to the fabric proceeds according to a predetermined path representing a pattern the anisotropic conductive thread travels through the fabric thickness to attach the patch to the fabric, and laterally across the fabric; and further comprising, before the step of stitching the circuit to the fabric, storing, on a computer readable medium, program instructions that when executed by the processor configure the predetermined path for stitching the anisotropic conductive thread into the fabric such that at least one electrically conductive segments of anisotropic conductive thread travels through the fabric thickness where the patch is attached to the fabric.

2. The method of claim 1, further comprising causing the processor to execute the program instructions, thereby stitching the anisotropic conductive thread to the fabric according to the predetermined path.

3. The method of claim 1, further comprising forming holes in the patch through which only electrically conductive segments of anisotropic conductive thread pass.

4. The method of claim 1, wherein the fabric has at least one seam that separates a first side of the fabric from a second side of the fabric, and further comprising configuring the predetermined path to stitch anisotropic conductive thread from fabric on the first side of the at least one seam to fabric on the second side of the at least one seam.

5. The method of claim 1, wherein the electrically conductive segments and electrically insulating segments are alternating.

6. The method of claim 1, further comprising forming anisotropic conductive thread by sensitizing selected areas of non-conducting thread for plating, and then exposing the sensitized thread to a solution that contains silver nitrate.

7. A method that uses a needle-directing machine having at least a needle, a needle bar, a head, an arm, and a processor that executes computer readable program instructions, the method being for attaching to a fabric having a thickness a plurality of electronic circuits each being arranged on a patch, the method comprising:

stitching two or more circuits to the fabric with anisotropic conductive thread having electrically conductive segments and electrically insulating segments;

wherein stitching the circuits to the fabric proceeds according to a predetermined path representing a pattern the anisotropic conductive thread travels through the fabric thickness to attach each patch to the fabric, and laterally across the fabric;

wherein the electrically insulating segments are arranged such that an electrical connection is not formed between any two circuits; and further comprising, before the step of stitching the circuit to the fabric, storing, on a computer readable medium, program instructions that when executed by the processor configures the predetermined path for stitching the anisotropic conductive thread into the fabric such that (i) at least one electrically conductive segments of anisotropic conductive thread travels through the fabric thickness where each patch is attached to the fabric, and (ii) at least one electrically insulating segment travels across the fabric between any two patches.

8. The method of claim 7, further comprising causing the processor to execute the program instructions, thereby stitching the anisotropic conductive thread to the fabric according to the predetermined path.

9. The method of claim 7, further comprising forming holes in the patch through which only electrically conductive segments of anisotropic conductive thread pass.

10. The method of claim 7, wherein the fabric has at least one seam that separates a first side of the fabric from a second side of the fabric, and further comprising configuring the predetermined path to stitch anisotropic conductive thread from fabric on the first side of the at least one seam to fabric on the second side of the at least one seam.

11. The method of claim 7, wherein the electrically conductive segments and electrically insulating segments are alternating.

12. The method of claim 7, further comprising forming anisotropic conductive thread by sensitizing selected areas of non-conducting thread for plating, and then exposing the thread to a solution that contains silver nitrate.

13. An article formed from a fabric, comprising:
at least two patches each being formed from a flexible substrate and each patch having an electronic circuit formed thereon;
wherein each circuit is electrically and mechanically connected to the article with anisotropic conductive thread having alternating electrically conductive segments and electrically insulating segments;
such that at least one electrically conductive segment passes through the substrate in a direction along a first spatial dimension and at least one electrically insulating segment extends between the at least two circuits moving in a second spatial dimension.

14. The article of claim 13, wherein the fabric forming the article has at least one seam that separates a first side of the fabric from a second side of the fabric, and wherein the anisotropic conductive thread is stitched from fabric on the first side of the at least one seam to fabric on the second side of the at least one seam.

15. The article of claim 13, further comprising a multi-pin electrical connection formed integrally with at least one of the circuits arranged for electrical connection to a printed circuit board.

* * * * *